US012050242B1

(12) United States Patent
Keller

(10) Patent No.: US 12,050,242 B1
(45) Date of Patent: Jul. 30, 2024

(54) HEALTH ASSESSMENT OF VEHICLES USING UNINTENDED EMISSIONS

(71) Applicant: Nokomis, Inc., Canonsburg, PA (US)

(72) Inventor: Alexander Keller, Bridgeville, PA (US)

(73) Assignee: Nokomis, Inc., Canonsburg, PA (US)

( * ) Notice: Subject to any disclaimer, the term of this patent is extended or adjusted under 35 U.S.C. 154(b) by 310 days.

(21) Appl. No.: 17/479,578

(22) Filed: Sep. 20, 2021

(51) Int. Cl.
*G01R 31/00* (2006.01)
*G07C 5/08* (2006.01)

(52) U.S. Cl.
CPC ......... *G01R 31/001* (2013.01); *G01R 31/006* (2013.01); *G07C 5/0808* (2013.01)

(58) Field of Classification Search
CPC ... G01R 31/001; G01R 31/006; G07C 5/0808
See application file for complete search history.

(56) References Cited

U.S. PATENT DOCUMENTS

| | | | | |
|---|---|---|---|---|
| 6,137,992 A * | 10/2000 | Mohan | ................... | H04B 17/20 455/226.1 |
| 6,483,865 B1 * | 11/2002 | Beierle | ................ | H04B 1/3805 375/130 |
| 2003/0167139 A1* | 9/2003 | Swartz | ................. | G01R 31/007 702/65 |
| 2009/0099830 A1* | 4/2009 | Gross | ................. | G01R 31/2813 703/14 |
| 2010/0033386 A1* | 2/2010 | Lewis | ................... | G01R 31/001 702/57 |
| 2013/0325383 A1* | 12/2013 | Williams, Jr. | ......... | G01R 31/62 702/66 |
| 2016/0327596 A1* | 11/2016 | Salajegheh | .......... | G01R 31/002 |
| 2017/0012714 A1* | 1/2017 | Kildal | .................. | H04B 17/102 |
| 2017/0169634 A1* | 6/2017 | Mattern | ............... | G07C 5/0841 |
| 2017/0234916 A1* | 8/2017 | Lawlis | ................. | G01R 31/007 701/34.4 |
| 2021/0358235 A1* | 11/2021 | Kwon | ..................... | B60Q 1/44 |

FOREIGN PATENT DOCUMENTS

WO  WO-2021037507 A1 * 3/2021  ........... G01R 31/001

OTHER PUBLICATIONS

Gheonjian et al., WO2021037507A1_Machine_Translation (Year: 2021).*

* cited by examiner

*Primary Examiner* — Jelani A Smith
*Assistant Examiner* — Alyssa Rorie
(74) *Attorney, Agent, or Firm* — AP Patents; Alexander Pokot

(57) ABSTRACT

An apparatus configured to assess health of electronic components in vehicles. This may be achieved by simply driving a vehicle into or through a physical device or over a physical device and determining the health of the vehicle. The apparatus may be comprised of a physical enclosure with antennas and a RF emission or other electromagnetic emission signature analyzer. The antennas capture unintended electronic emissions from the vehicle which provide the electromagnetic signatures of the electronic component to the signature analyzer. The evolution of the unintended electromagnetic emissions signature as the electronics ages is measured and evaluated, providing a measure of the health of the electronics within the vehicle. The apparatus may have an ultra-sensitive RF collection portion with a sensitivity preferably of at least −150 dBm. The RF collection portion may measure bandwidths of at least 100 MHz and may have a frequency resolution of 1 Hz or better.

23 Claims, 6 Drawing Sheets

HEALTH ASSESSMENT OF VEHICLES USING UNINTENDED EMISSIONS

CROSS-REFERENCE TO RELATED APPLICATIONS

N/A

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX N/A

TECHNICAL FIELD

The subject matter relates, in general, to an apparatus and a method for health assessment of electrical and/or electronic devices within a vehicle. The subject matter may relate to detecting aging or degradation in electrical and/or electronic devices within a vehicle. The subject matter may further relate to an enclosure or a near-vehicle structure configured to receive and process unintended RF emissions from a vehicle to determine characteristics of the operating electronic and/or electrical devices within the vehicle.

BRIEF DESCRIPTION OF THE DRAWINGS

The accompanying drawings are incorporated in and constitute part of the specification and illustrate various embodiments. In the drawings.

DETAILED DESCRIPTION

Figure 1:
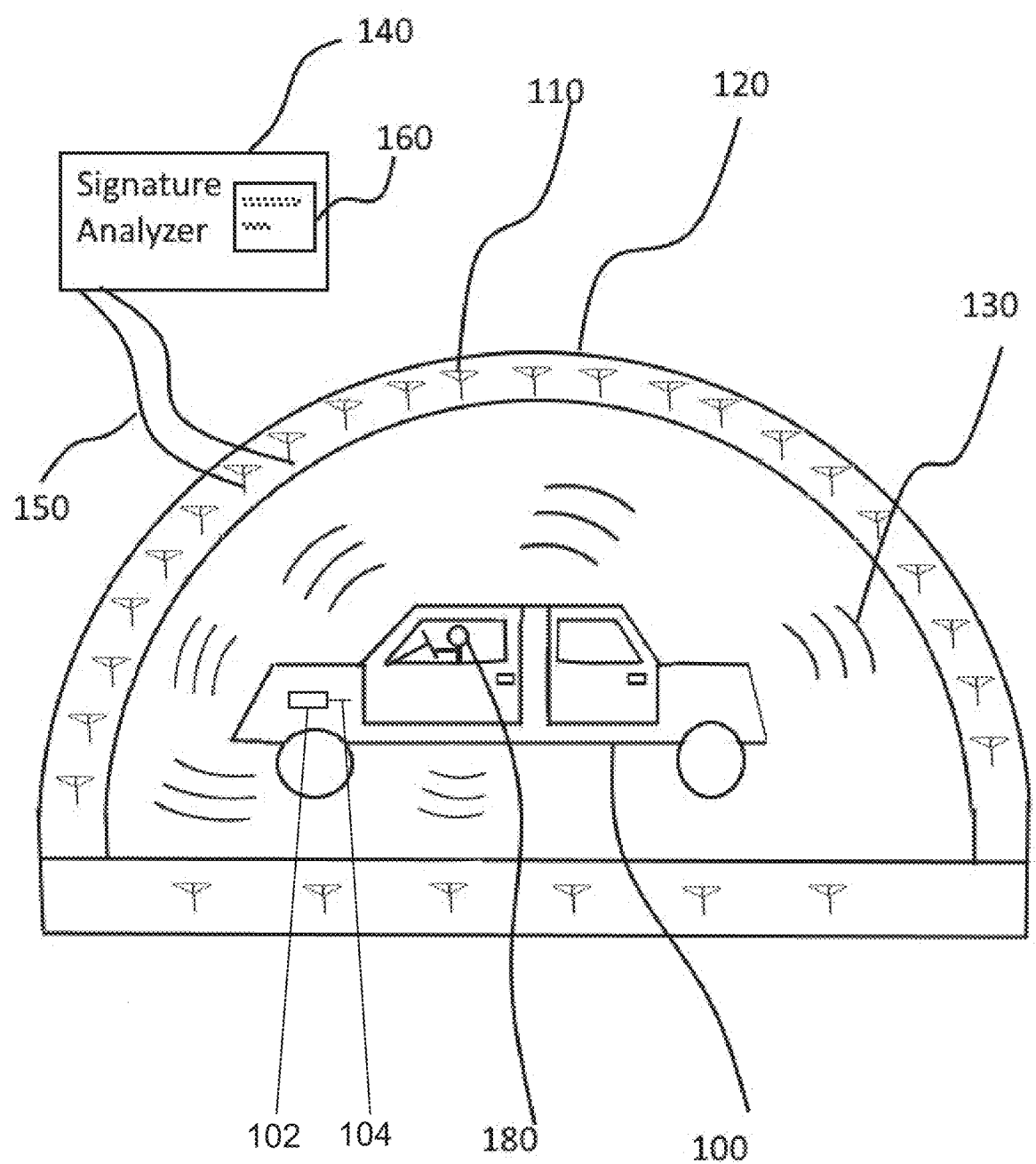
FIG. 1 illustrates a vehicle within an enclosure emitting unintended radio frequency (RF) radiation and an antenna or antennas receiving the RF radiation and process it to perform an evaluation.

Prior to proceeding to the more detailed description of the present subject matter, it should be noted that, for the sake of clarity and understanding, identical components which have identical functions have been identified with identical reference numerals throughout the several views illustrated in the drawing figures.

Features which are described in the context of separate embodiments may also be provided in combination in a single embodiment. Conversely, various features which are, for brevity, described in the context of a single embodiment, may also be provided separately or in any suitable subcombination. The Applicant hereby gives notice that new Claims may be formulated to such features and/or combinations of such features during the prosecution of the present Application or of any further Application derived therefrom.

It is to be understood that the singular forms "a," "an," and "the" include plural referents unless the context clearly dictates otherwise or expressly specified otherwise. Thus, for example, reference to "a component surface" includes reference to one or more of such surfaces.

For purposes here, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives.

For purposes here, the words "comprising," "including," "having," and variants thereof, wherever they appear, shall be construed as open-ended terminology, with the same meaning as if the phrase "at least" were appended after each instance thereof.

The verb "may" is used to designate optionality/noncompulsoriness. In other words, something that "may" can, but need not.

Before elucidating the subject matter shown in the Figures, the present disclosure will be first described in general terms.

An electrical, electromechanical or the electronic device produces and radiates electromagnetic emissions when powered. Current flow through internal circuitry, and the inherent acceleration and deceleration of electrons, results in spontaneous emissions that are dependent upon path length, geometry, and the electrical properties of the circuitry used (reactance, resistivity, etc.). As such, the unintended emissions of an electrical, electromechanical or electronic component directly relate to its internal circuitry and material composition.

In a vehicle, the electrical component may be an alternator and/or wiring connecting the alternator to the control unit of the vehicle. The electrical component may be a radio and/or wiring connecting the radio to the control unit of the vehicle. The electrical component may be a sensor and/or wiring connecting the sensor to the control unit of the vehicle. The electrical component may be a voltage inverter. The electromechanical component may be an electric motor. The electromechanical component may be an electric traction motor. The electromechanical component may be a relay. The electronic component may be an engine control unit or an engine controller. The electronic component may be a transmission control unit or a transmission controller. For the sake of brevity, any such component may be referred to hereinafter as "electrical component".

The emission may comprise an emission in a radio frequency (RF) range of the electromagnetic spectrum. This emission may be referred to as RF emission. RF emission may be in a frequency range from 1 MZh to 300 GHz. The emission may comprise a millimeter wave emission. The emission may comprise an emission in an infrared (IR) range of the electromagnetic spectrum. This emission may be referred to as IR emission. The specific emissions produced by an electrical or an electronic component are unique to circuitry, functionality, status, and condition of the component. As such, the emissions can be considered a signature or fingerprint, providing metrics that are leverageable assessing health of the electrical or electronic device within the vehicle. The signature may comprise a waveform. In other words, the signature may be referred to as a signature waveform. The emission signature has fundamental properties, including, but not limited to, magnitude, frequency location, feature structure, phase noise parameters, integrated emission energy, emitted energy state distribution, harmonic relationships, and non-linear mixing product parameters. The signature may comprises a plurality of waveforms in a time domain. The signature may also comprise a portion of a spectrum at a specific (specified) frequency in a frequency domain. The signature may also comprise a portion of a spectrum at a specific (specified) bandwidth in a frequency domain. The signature may also comprise a portion of a spectrum at a specific (specified) a resolution bandwidth (rBW) in a frequency domain.

The emission may be an intended emission. In a non-limiting example, such intended emission may be given off by a functioning component of the vehicle. Emission may be an unintended emission. In a non-limiting example, such unintended emission may be given off by a wire electrically connecting an electrical component. The unintended emission may be considered as an Electromagnetic Interference (EMI) in certain applications. For automotive applications, Comité International Special des Perturbations Radioélectriques (CISPR) 25 is a standard that presents several test methods, with suggested limits, to evaluate the level of radiated emissions from a component designed for installation in a vehicle. CISPR 25 seeks to limit the emissions from vehicles and vehicle subsystems, but the waveforms produced by electronics are information rich, providing indirect access to the internal mechanisms and functionality of the electronic device. Another applicable standard is ISO 11452-2 and for military vehicles MIL-STD-461 standard applies.

An apparatus comprises an antenna configured to capture an emission of an electromagnetic energy from an electrical component of the vehicle. The apparatus may further comprise an antenna mounting component. The antenna mounting component may be designed as an elongated post to position antenna at a distance from a ground surface that the vehicle is driving or standing on. The distance may be such that the antenna is positioned above the vehicle. The distance may be such that the antenna is positioned at the ground surface. The distance may be such that the antenna is positioned below a roof line of the vehicle. The antenna mounting component may be designed to be positioned under the vehicle.

The antenna mounting component may be designed as an enclosure with a hollow interior configured to receive a vehicle therewithin. The enclosure may comprise a peripheral wall defining two open ends, an open side and a hollow interior between the two open ends and the open side, the hollow interior configured to receive the vehicle therewithin. The peripheral wall may comprise an arcuate shape in a plane being normal to the distance between the two open ends. The arcuate shape does not have to be continuous and may comprise a flat portion or portions. The arcuately shaped wall may comprise a wall component closing the open side. Such wall component may be referred to as a base. The base may comprise a portion of the ground surface. The portion of the ground surface may be manufactured from a concrete material. In other words, the enclosure may be designed to comprise a base and a peripheral wall, where the peripheral wall and the base define, in a combination with each other, two open ends and a hollow interior between two open ends, the hollow interior configured to receive the vehicle therewithin. The antenna may be disposed within the peripheral wall. The antenna may be attached to an exterior surface of the wall. The enclosure may be referred to as an antenna enclosure. The base may be provided independently from the peripheral wall. The base may be sized to span a length and/or width of the vehicle. The base may be sized to only span a portion of the vehicle.

The apparatus may comprise a base without the peripheral wall. In other words, the peripheral wall may be an optional component. The base may be provided as a floor with a vehicle driving on a surface of the floor. The floor may comprise a concrete material. In other words, the base may comprise concrete material with the antenna embedded therewithin. The floor may comprise a cement material. The floor may comprise an asphalt material. The floor may comprise a dirt. The floor may comprise a composite material. When the base is provided without the peripheral wall, the antenna may be imbedded into the floor below the floor surface. The antenna may be positioned on a floor surface. For example, an optional pad may be positioned in a contact with the floor surface, with the pad containing the antenna. In other words, the antenna may be disposed, either directly or indirectly, on a surface of the base and/or the antenna may be disposed, entirely or partially, within the based. When antenna is disposed entirely within the base (i.e. imbedded), the antenna may be hidden from view.

The antenna may be disposed within the base. The antenna may be imbedded within a concrete material The antenna may comprise an array of antennas disposed within the peripheral wall, the plurality of antennas being further disposed at a distance from each other within a plane being normal to a distance between the two open ends.

The antenna may comprise a plurality of antennas disposed within the peripheral wall, the plurality of antennas defining rows of antennas being spaced apart from each other along a distance between the two open ends, each row of rows of antenna comprising portions of antennas from the plurality of the antennas, each portion of antennas comprising antennas disposed a distance from each other within a plane being normal to the distance between the two open ends.

The antenna may comprise a single row of antennas spaced apart from each other along a distance between the two open ends. The antenna may comprise an array of antennas disposed within the base. The antenna may comprise an orthogonal grid of antennas disposed within the base.

The antenna may be configured to capture unintended RF emissions.

An emission signature analyzer is coupled to the antenna. The emission signature analyzer configured to analyze a signature of the electromagnetic emission captured by the antenna. The emission signature analyzer may be referred to as any one of an emission analyzer, a signature analyzer, an analyzer, an RF emission signature analyzer, an RF signature analyzer, an RF emission analyzer, an RF analyzer, and an IR analyzer. The emission analyzer may comprise a receiver configured to receive the RF emission from the antenna and convert the RF emission into the digital form and a control unit configured to process the signature of the emission in the digital form.

The control unit may comprise one or more processors and a non-transitory memory (Storage medium) having executable instructions stored thereon that when executed by the processor cause the processor to perform operations comprising at least identifying non-linear products (NPLs) within the signature, and comparing identified NPLs with the baseline NPLs. The control unit may comprise a real-time spectrum analyzer (RISA).

The executable instructions may include at least one of Harmonic Analysis, Matched Filter, non-harmonic correlation, timing correlation, Artificial Neural Networks (ANN), specifically multilayer perception (MLP) feed-forward ANN with back propagation (BP), Wavelet Decomposition, Autocorrelation, Spectral Feature Measurements or Statistics, Clustering or Phase Detrending algorithms.

The control unit may be referred to as a processing device.

The operations may further comprise determining aging of a component within the vehicle based on a comparison between identified NPLS and baseline NPLs.

The operations may further comprise calculating a remaining useful life (RUL) of a component within the vehicle based on a comparison between identified NPLs and baseline NPLs. RUL may define a stress level condition of the electrical device.

The operations may further comprise assessing a health a component within the vehicle based on a comparison between identified NPLS and baseline NPLs. Health may be related to performance of the component at the time of assessment. Health may manifest as a degradation of the component. Health may manifest as a remaining useful life of the component.

The receiver may be designed with a high sensitivity of at least −150 dBm. This design may be achieved by using a low noise amplifier (LNA) with a power gain of about 20 dB and a noise figure lower than about 1.0. An analog-to-digital converter (ADC) may be used in a combination with the LNA. The ADC may be a 16-bit ADC. A filter may be mounted in a circuit before the LNA, where the signal from the antenna will be first filtered through the filter prior to input into LNA. The filter may comprise a bandpass filter. The filter may comprise a highpass filter. The filter may be a lowpass filter. The filter may comprise a selectable filter bank. The selectable filter bank may be connected in a signal path between the LNA and the ADC. The selectable filter bank may be connected in a signal path between ADC and emission signal processing. The selectable filter bank may comprise an array of band-pass filters, the selectable filter bank separates the frequency signal in the analog form into components, each component carrying a single frequency sub-band of the frequency signal in the analog form.

This emission signature analyzer may be designed to analyze RF emissions levels that are substantially below the radiated emissions, as governed by the above described standards, and provide health assessment of a component or components.

As an example, the emission signature analyzer may measure bandwidths of at least 100 MHz at a frequency resolution of at least 1 Hz. A Fourier Transform, for example such as a Discrete Furrier Transform (DFT) or a Fast Furrier Transform (FFT) may be used to process the incoming RF emission signal from the antenna to provide this frequency resolution result. Electromagnetic signature elements and signature region 2-D patterns for comparison purposes may be extracted across a wide frequency band via quantitative analysis. Such signature elements for quantitative analysis may include averaged or statistical quantities representing measurements including the noise floor level, phase noise distribution, absolute and relative peak locations to other peaks, non-linear product peak envelope shape, and the structure of identified peaks.

The emission signature analyzer may be designed as a wideband RF measurement diagnostic device comprised of a sensor apparatus that includes at least one antenna, a low noise amplifier and a radio frequency collection apparatus, an analog to digital converter to convert analog waveforms into digital format, a control unit with a digital signal processing capability and software comprised of algorithms which may be used to detect anomalies in the received spectrum of RF emissions to detect any one of aging, degradation and remaining useful life (RUL) in automotive electrical components. The control unit may comprise a search engine that automatically searches the collected spectrum for patterns of non-linear mixing product (NPLs) in the collected emission signature. The measured NPLs may be compared with NPLs of previously acquired measurements when the vehicle emissions or an exemplary vehicle's emissions was measured at an earlier time.

The control unit may be configured to use characteristics, such as any one of correlation of harmonics in the received RF spectrum, a dB vs. frequency pattern of specific RF emission location changes, the frequency location and/or dB correlation of non-harmonically related peaks in the received spectrum to make assessments about the health of vehicle's electrical components.

A characteristic, such as frequency vs. dB pattern or voltage vs. time may be discerned from the captured emissions data of at least one of in a time domain form or in a frequency domain form.

The control unit may measure a change in a signal strength or field strength as the vehicle moves relative to the antenna to detect the degradation anomaly and even determine the location of a degraded emission source. The detectable anomalies may include a semiconductor degradation, a degradation in bonding of the semiconductor to leads in a part, and a degradation in the circuit board that the electronic devices are connected to as well the interconnects between board and individual electronic modules that are interconnected in modern vehicles. The cause of the degradation can be aging or low levels of arcing due to Electrostatic discharge. These can be detected by high frequency analysis of received unintended RF vehicle emissions from a wide band antenna signal (and/or magnetic field probe) using a matched filter model.

The emission signature analyzer may be configured to exploit subtle, yet distinctly characteristic fingerprint-like patterns of unintended RF emissions to detect anomalous electrical component. The apparatus may have a plurality of RF emission acquisition and processing channels which act independently, facilitating the ability to analyze signature indicators simultaneously in different spectral regions. A multi-channel apparatus enables simultaneous assessment of emissions data in multiple frequency regions providing a more rapid and powerful breakthrough capability in the battle against bad parts. The apparatus may comprise two or more channels. The apparatus may comprise four channels.

The emission signature analyzer may be configured to acquire multiple measurements from multiple occurrences, when the vehicle within the operating range of an antenna array, to determine a pattern of RF emission change indicating an estimated duration before the electrical component in the vehicle fails. The antenna array may be installed within a vehicle service facility. The antenna array may be installed within a vehicle washer as the vehicle will be pulled through an antenna enclosure.

This emission signature analyzer may be configured as an ultra-sensitive RF emission sensor system that not only captures low level emissions only a few dB above the theoretical thermal noise floor of −174 dBm at 1 Hz RBW, but also resolves very fine characteristic frequency features, thus offering the capability of presenting more than sufficient separate data points for subsequent analysis. The very fine frequency resolution may extend to 1/100 Hz RBW and be presented in bins in a software algorithm at resolution of anywhere from 10 Hz to 1/100 Hz.

A complementary software and algorithms associated with the hardware may be capable of discerning differences between complex features buried deep within the acquired electromagnetic spectrum on a real-time basis.

The apparatus may be configured with a scanner to scan (read) the vehicle identification number (VIN) to uniquely identify the vehicle for future use or to reference the vehicle's past RF emission data or RF emission data evaluations. This data may be associated with the vehicle and be sent or reside in a database distant from the system near the vehicle, such as in a different city. Multiple systems may be located across a region or country, and thus RF emissions data acquired and processed from differing geographic locations and at differing times for the same vehicle may be compared to detect rate of degradation or change from previously acquired data. Similarly, multiple vehicles of the same make or model may be combined to form an exemplary average of expected RF emissions at what vehicle age for comparison with a specific vehicle to determine degree of deviation from the expected norm, and a ranking, threshold, or decision made based on percentile of deviation. Such a threshold may result in a decision to be made and transmitted by email to the owner recommending replacement of one or more components expected to fail soon.

In view of the above, a method may comprise capturing, with an antenna disposed external to a vehicle, an emission of electromagnetic energy from a component within the vehicle; processing, with an analyzer coupled to the antenna, a signature of the emission; and determining a condition of the component based on a processed signature of the emission.

Capturing of the emission may comprise driving a vehicle through a hollow interior of a structure, the structure having the antenna mounted within a wall thickness of the structure. Capturing of the emission may comprise driving a vehicle over a structure having the antenna disposed therewithin. The antenna may be mounted so as to be positioned below an engine cavity of the vehicle that acts as a guide to direct Emissions toward the antenna. Emissions may be from an engine controller. Emissions may be from a transmission controller. Emissions may be from a sensor. Emissions may be from a wiring harness. Capturing of the emission may comprise positioning a vehicle within a hollow interior of a structure, the antenna mounted within a wall thickness of the structure. Capturing of the emission may comprise positioning a vehicle within a hollow interior of a peripheral wall and mounting the antenna within the peripheral wall. Capturing of the emission may comprise positioning a vehicle within a hollow interior of a structure comprising a peripheral wall and a base and mounting the antenna within the peripheral wall. Capturing of the emission may comprise positioning a vehicle within a hollow interior of a structure comprising a peripheral wall and a base and mounting the antenna within the base, the base configured to support the vehicle thereon. Capturing of the emission may comprise tuning the antenna to a narrow frequency band. Capturing of the emission may comprise positioning antenna and the vehicle in a stationary relationship relative to one another. Capturing of the emission may comprise positioning an engine cavity of the vehicle over a mat having antenna disposed therewithin.

Processing of the emission may comprise a correlation of harmonics in a signature of a captured Emission. Processing of the emission may comprise comparing amplitude versus frequency pattern in a signature of a captured emission. Processing of the Emission may comprise analyzing frequency locations of non-harmonically related peaks in a signature of a captured Emission. Processing of the emission may comprise analyzing amplitudes of non-harmonically related peaks in a signature of a captured emission. Processing of the emission may comprise measuring a change in a signal strength as the vehicle moves relative to an antenna location. Processing of the emission may comprise providing the antenna as a plurality of antennas and spatially correlating measurements of signatures from the plurality of antennas. Processing of the emission may comprise providing the antenna as a plurality of antennas, tunning antennas to different frequencies and correlating measurements of signatures across different frequencies.

In view of the above, a method may comprise capturing, with an antenna, a radio frequency (RF) emission from an electrical component or an electrical connection to/from the electrical component within the vehicle; processing, with a processing device coupled to the antenna, a signature of the RF emission; and determining a condition of the component based on a processed signature of the RF emission.

The antenna may be disposed external to the vehicle. The antenna may be provided independently from the vehicle but may be disposed within the confines of the vehicle during testing. The confines may be an engine cavity.

The electrical connection may comprise a wire electrically connecting one electrical component to another electrical component.

Capturing of the RF emission may comprise moving a vehicle through a hollow interior of a structure, the structure having the antenna mounted within a wall thickness of the structure.

Capturing of the RF emission may comprise moving a vehicle over a structure having the antenna, as described above. The structure may be the base, as described above. The antenna may be mounted so as to be positioned below an engine cavity of the vehicle that acts as a guide to direct RF emissions toward the antenna. Vehicle may be moved and positioned so that the antenna is positioned below an engine cavity of the vehicle. RF emissions may be from an engine controller. RF emissions may be from a transmission controller. RF emissions may be from a sensor. RF emissions may be from a wiring harness. Capturing of the RF emission may comprise positioning a vehicle within a hollow interior of a structure, the antenna mounted within a wall thickness of the structure. Capturing of the RF emission may comprise positioning a vehicle within a hollow interior of a peripheral wall and mounting the antenna within the peripheral wall. Capturing of the RF emission may comprise positioning a vehicle within a hollow interior of a structure comprising a peripheral wall and a base and mounting the antenna within the peripheral wall. Capturing of the RF emission may comprise positioning a vehicle within a hollow interior of a structure comprising a peripheral wall and a base and mounting the antenna within the base, the base configured to support the vehicle thereon. Capturing of the RF emission may comprise tuning the antenna to a narrow frequency band. Capturing of the RF emission may comprise positioning antenna and the vehicle in a stationary relationship relative to one another. Capturing of the RF emission may comprise positioning an engine cavity of the vehicle over a mat having antenna disposed therewithin.

Processing of the RF emission may comprise a correlation of harmonics in a signature of a captured RF emission. Processing of the RF emission may comprise comparing amplitude versus frequency pattern in a signature of a captured RF emission. Processing of the RF emission may comprise analyzing frequency locations of non-harmonically related peaks in a signature of a captured RF emission. Processing of the RF emission may comprise analyzing amplitudes of non-harmonically related peaks in a signature of a captured RF emission. Processing of the RF emission may comprise measuring a change in a signal strength as the vehicle moves relative to an antenna location. Processing of the RF emission may comprise providing the antenna as a plurality of antennas and spatially correlating measurements of signatures from the plurality of antennas. Processing of the RF emission may comprise providing the antenna as a plurality of antennas, tunning antennas to different frequencies and correlating measurements of signatures across different frequencies.

The method, as described above, may further comprise determining a location of degraded RF emission source in the vehicle in a response to a measured change.

The method, as described above, may further comprise reading, with a scanner, vehicle identification number (VIN) to uniquely identify the vehicle for future use or to reference past RF emissions data or RF emissions data evaluations of the vehicle.

The method, as described above, may further comprise using past RF emissions data from different geographical locations related to the vehicle to detect a rate of degradation or a change from previously acquired RF emissions data.

The method, as described above, may further comprise using past RF emissions data from different vehicles of same make and model to form an average of expected signatures of RF emissions representing vehicle aging to determine a degree of deviation from a baseline, and determine one of a ranking, a threshold, and a calculation made based on a percentile of the deviation.

The method, as described above, may further comprise positioning the vehicle on a dynamometer to simulate motion or loading of the drive system.

The mode of operation of the apparatus is directed to acquiring the vehicles' electromagnetic waveforms from antenna locations external to the vehicle. Antennas may be attached to LNAs to amplify the received RF emissions before sending RF emissions down a coax cable to the analysis unit. Antennas under the vehicle such as in the roadbed or in a mat may receive much stronger emissions from devices under the hood and thus may be dedicated to analysis of specific devices associated with those emissions. Conversely, antennas over the vehicle, or to one side of the vehicle may be dedicated to receiving and processing RF emissions from devices in the passenger compartment or nearest one side of the passenger compartment. The RF emissions, as analog signals, to be processed may be better received from wiring or wiring harnesses than from the devices themselves in some cases.

The emission signature analyzer, as described above, is configured for a non-contact advanced analysis and assessment of the radiated electromagnetic emissions of the electronic devices at the component, board, and vehicle level. Aging Assessment of Vehicle Electronics performs a variety of advanced assessment, prognostics, and detection of components that assesses physical degradations.

The RF signature analyzer, as described above, is configured to perform advanced diagnostics and prognostic functions to determine the reliability and stability of the vehicle as a whole or individual devices or components within the vehicle.

The above apparatus and method may be implemented as a computer program executing on a machine, as a computer program product, or as a tangible and/or non-transitory computer-readable medium having stored instructions.

Tangible computer readable medium means any physical object or computer element that can store and/or execute computer instructions. Examples of tangible computer readable medium include, but not limited to, a compact disc (CD), digital versatile disc (DVD), blu-ray disc (BD), USB, floppy drive, floppy disk, random access memory (RAM), read-only memory (ROM), erasable programmable read-only memory (EPROM), optical fiber, etc. It should be noted that the tangible computer readable medium may even be paper or other suitable medium in which the instructions can be electronically captured, such as optical scanning. Where optical scanning occurs, the instructions may be compiled, interpreted, or otherwise processed in a suitable manner, if necessary, and then stored in computer memory.

The disclosed method may be implemented in the form of software stored on a computer-readable non-transitory information storage medium such as an optical or magnetic disk, a non-volatile memory (e.g., Flash or ROM), RAM, and other forms of volatile memory. The information storage medium may be an internal part of the computer, a removable external element coupled to the computer, or unit that is remotely accessible via a wired or wireless network.

Program code for carrying out operations for aspects of various embodiments may be written in any combination of one or more programming languages, including an object oriented programming language, such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

As electrical devices, especially microelectronics become more prevalent, advanced or complex in vehicles, the apparatus and the method, as described above, identify, in a non-contact and in a real-time manner and through evaluation of changes to the unintended RF emissions of the components and interconnects of associated subsystems, any one of aging, reliability, remaining capability of the vehicle, potential threats and vulnerabilities.

The analysis and evaluation of these RF emissions may provide an accurate determination of both the health state of the device, thereby predicting probability of fault, as well as providing a prediction of the RUL of the component or the subsystem under test. The ability to diagnose and predict the RUL of the electrical component(s) within vehicles will enable more accurate testing and more rapid testing, as well as new predictive regimens of maintenance.

The apparatus and/or method, as described above, may potentially provide significant future cost savings for owners in the proactive maintenance of automobiles, trucks, first responder vehicles, heavy equipment or any other ground or airborne vehicles, by identifying and/or predicting RUL.

The apparatus and/or method, as described above, may potentially improve design of the vehicle through emissions being captured and analyzed during testing in the research and development phase of the vehicle to identify an electrical component with a less than desired operating life.

In view of the above, the described apparatus may utilize the causal relationship between the internal circuitry of an electrical or electromechanical component, part, subsystem or system and its unintended emission signature and uses this predetermined relationship to identify aged components, monitor electronic health, detect counterfeits, and detect degradation related to component, part, subsystem or system integrity.

The apparatus may be configured and/or used to assess aging of the vehicle electronics by exploiting unintended electromagnetic emissions from electronic and microelectronic devices that are integrated into and critical for the operation of modern vehicles. Emission exploitation may be a reliable and immutable method to identify electronic devices based on their fundamental electronic activity.

The apparatus and/or method, as described above, may be used to determine RUL of the electrical component by comparing processed emission signature against a signature profile that has been obtained for the electrical component at different stages of the life cycle of such electrical component.

The apparatus and/or method, as described above, may be used to determine a stress condition or a stress level of the electrical component by comparing processed emission signature against a signature profile that may have been obtained for the electrical component at different voltage levels or at different power levels.

The apparatus may be completely non-invasive and requires very simple test parameters.

In view of the above, the vehicle may be simply driven through the apparatus taught herein which analyzes the vehicles unintended emissions and reports the health and/or RUL of components, parts, subsystems or systems within the vehicle. It performs this analysis using a physical apparatus comprised of antennas and a signature analyzer. The antenna captures unintended electronic emissions from the vehicle's electronics or electromechanical devices. The captured unintended electromagnetic emissions signature is processed to determine the health of the vehicle.

Although the above descriptions referred to RF emission, the emission signature analyzer, as described above, may be configured to receive and process a microwave emission.

In order to acquire and enhance the emissions data, the apparatus may use an ultra-sensitive RF or microwave system which is a non-invasive instrument that detects emission signature patterns from standard, degraded or substandard electronic piece parts, populated circuit boards, or fully integrated electronic devices within seconds.

In an embodiment, a signature analyzer such as a Real Time Spectrum Analyzer, Swept Spectrum Analyzer, or oscilloscope may be used with the antenna or antenna array to process the measurement.

In an embodiment, aging anomalies can be detected with free field electromagnetic diagnostics.

Now in a reference to Figures.

FIG. 1 illustrates an exemplary apparatus 120 configured in a form factor to enclose a vehicle 100 and operable to monitor, detect and/or differentiate between properly operating, unaged device(s), and aged or degraded versions of electrical device(s) within the vehicle.

In FIG. 1, the apparatus 120 is shown as operating in an exemplary environment, acquiring emissions 130 from the vehicle 100. The vehicle 100 may be an aircraft, ship, train, automobile, truck, and the like. The vehicle 100 is illustrated as radiating one or more RF emission 130 from an electrical component 102 or an electrical connection 104 to/from the electrical component 102. RF emissions are received by antennas 110, illustrated as being disposed within the enclosure and sent to a signature analyzer 140 over a cabling 150. The cabling 150 may be of a coaxial type. RF signature analyzer 140 is configured to perform a comparison analysis in the frequency domain or time domain against previously established exemplary emissions from the same or like vehicle, or exemplary devices or simulations of the devices within the vehicle. The results of the comparison analysis may be displayed on the screen 160 for appropriate action to be taken such as replace an electronic component, wait to replace it, estimate when it will need replaced, or do nothing at the present.

The apparatus 120 may also be attached to a ground and thus grounded to form a more effective shield from external RF radiation not associated with the vehicle.

Figure 2:
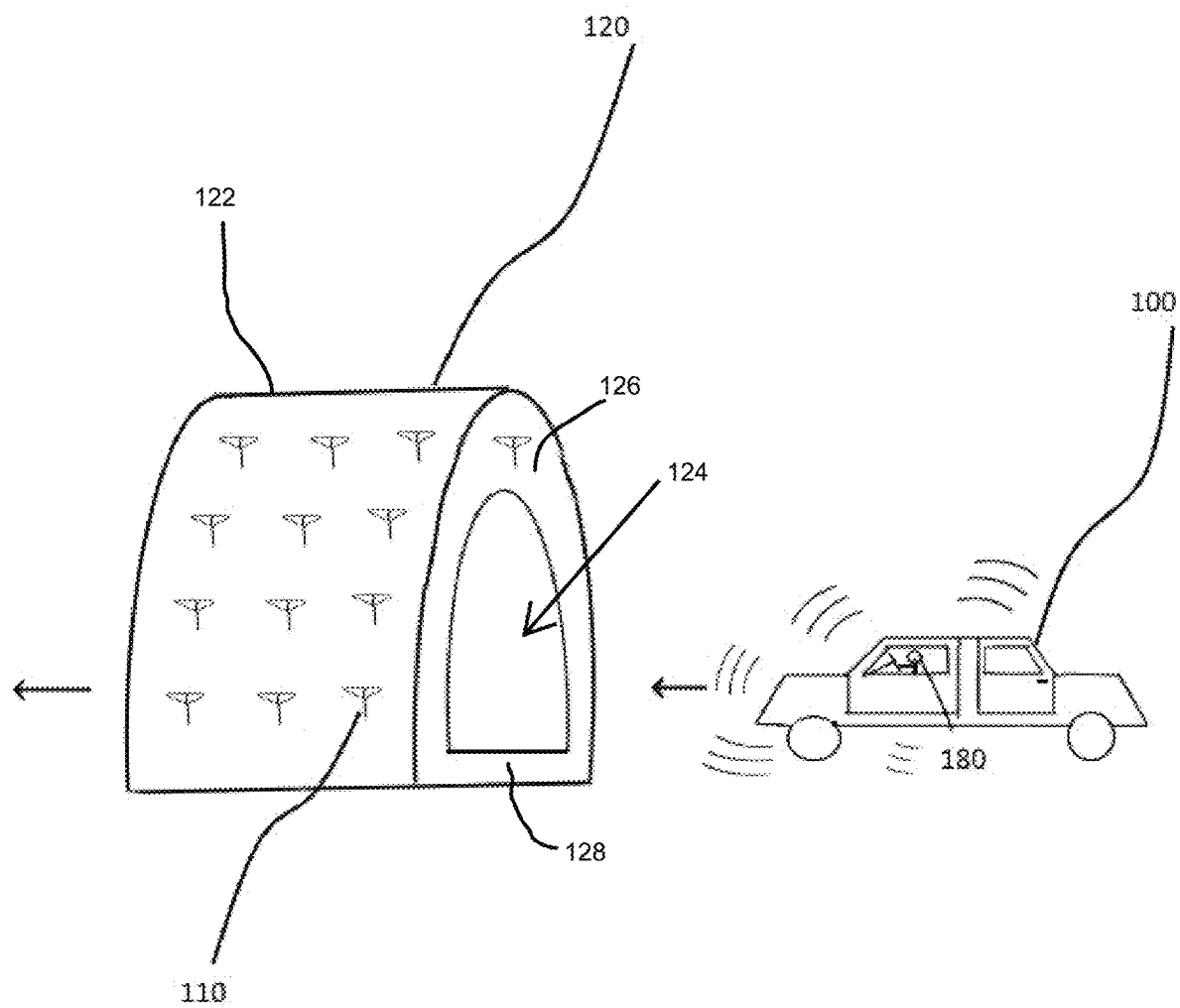
FIG. 2 illustrates a vehicle about to drive through a tunnel-like enclosure such as a car wash containing the elements in FIG. 1.

FIG. 2 illustrates the vehicle 100 about to be driven by a person 180 into a tunnel like enclosure 122 open on two sides. Inside the tunnel, the operation would be the same as described in FIG. 1.

Figure 3:
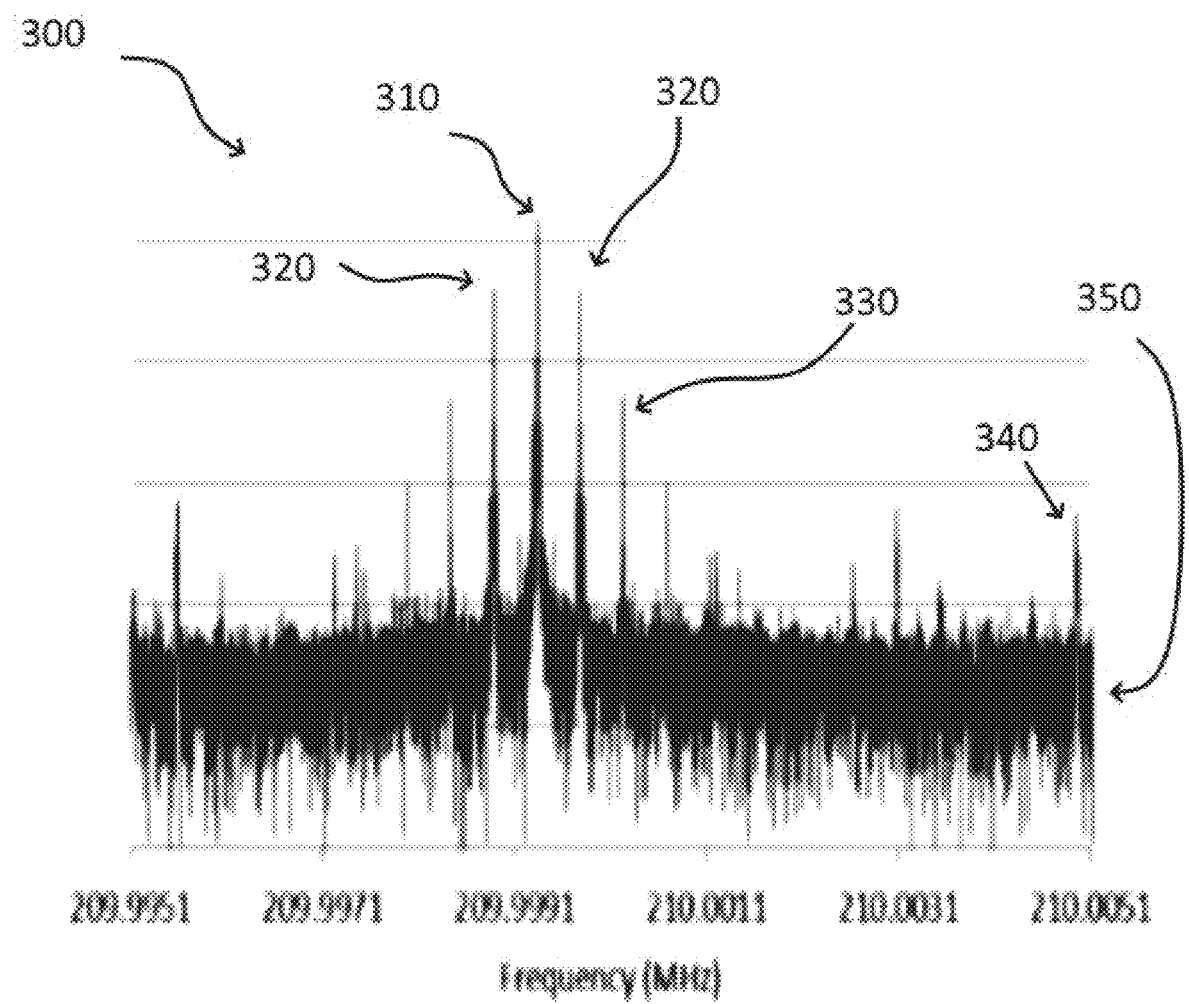
FIG. 3 Illustrates a frequency domain (x-axis) vs. amplitude (y-axis) exemplary unintended RF emission of non-linear products emanating from an electrical device or a subsystem unit which may be used to determine its operational characteristics such as remaining useful life (RUL), degradation, or functional status.

FIG. 3 illustrates an exemplary frequency domain region containing received spectral data or emitted RF noise to be processed for evaluation and the determination of vehicle electronics' condition. Reference numeral 300 denotes a spectrum of an exemplary set of non-linear products emitted from vehicle associated electromagnetic emissions. Reference numeral 310 denotes center peak of an emission 300 showing its specific frequency location and dBm level. Reference numeral 320 denotes side peaks of the center peak 310 showing frequency locations relative to 310 and dB levels relative to 310. Reference numeral 330 denotes additional side peaks that may be associated with the center peak 310 showing frequency locations relative to the center peak 310 and dB levels relative to the center peak 310. Reference numeral 340 denotes a peak which may or may not be relevant to the diagnosis depending on the prior results of analysis determination. Reference numeral 350 denotes a noise floor.

Figure 4:
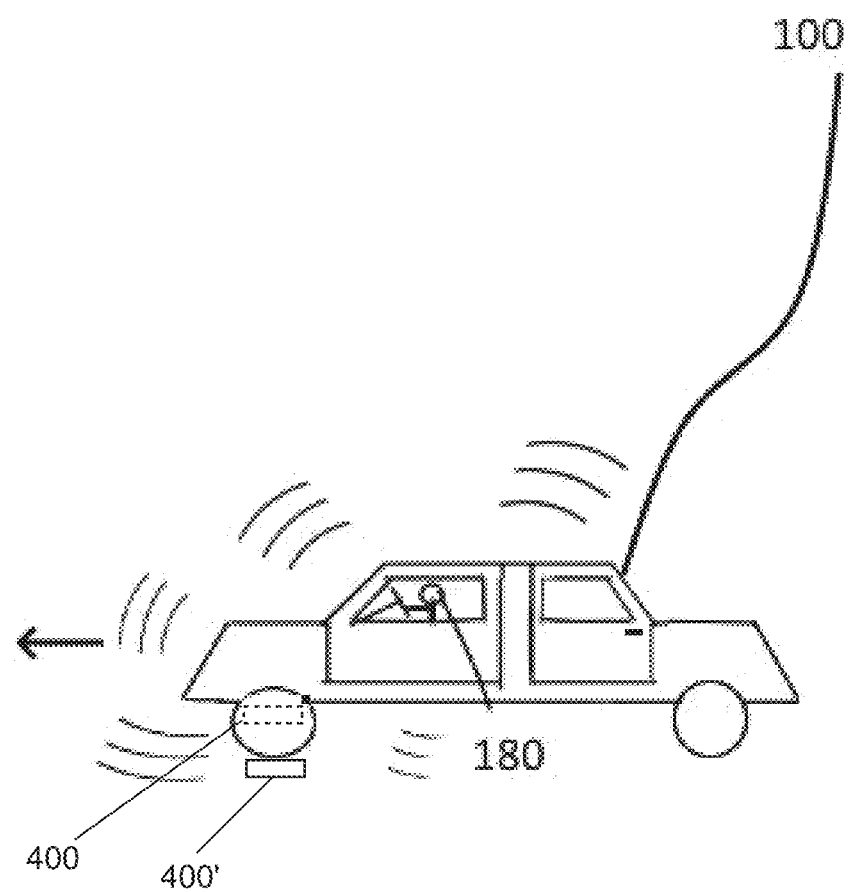
FIG. 4 illustrates a vehicle in a combination with a device that is positionable in a proximity of an engine cavity.

FIG. 4 illustrates a vehicle 100 in a combination with a device 400. The device 400 comprises antenna and may also comprise the emission signature analyzer 140. Or the emission signature analyzer 160 may be disposed remotely from the device 400. The device 400 is illustrates as being positioned under the engine cavity. The device 400 may be elevated above the ground surface. The device 400 may be configured with an optional actuator (not shown) to be raised above the ground surface so that the device 400 may be positioned closer to the engine cavity or within confines thereof. The device 400 may be also provided in a mat-shaped configuration to be positioned under the tire(s), as represented by a numeral 400'.

Figure 5:
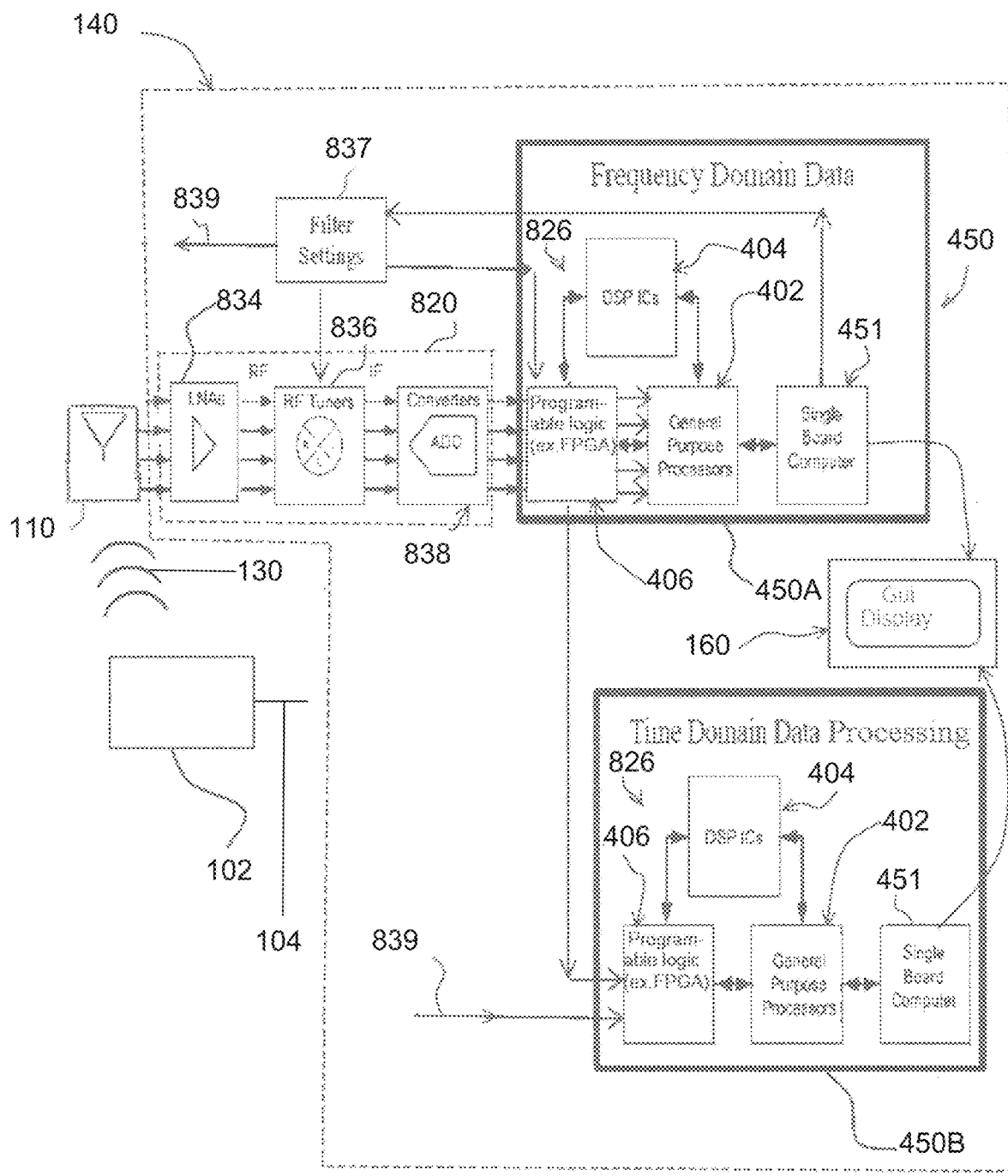
FIG. 5 illustrates a block diagram of an exemplary emission signature analyzer configured to receive and process unintended emissions captured by an antenna.
Figure 6:
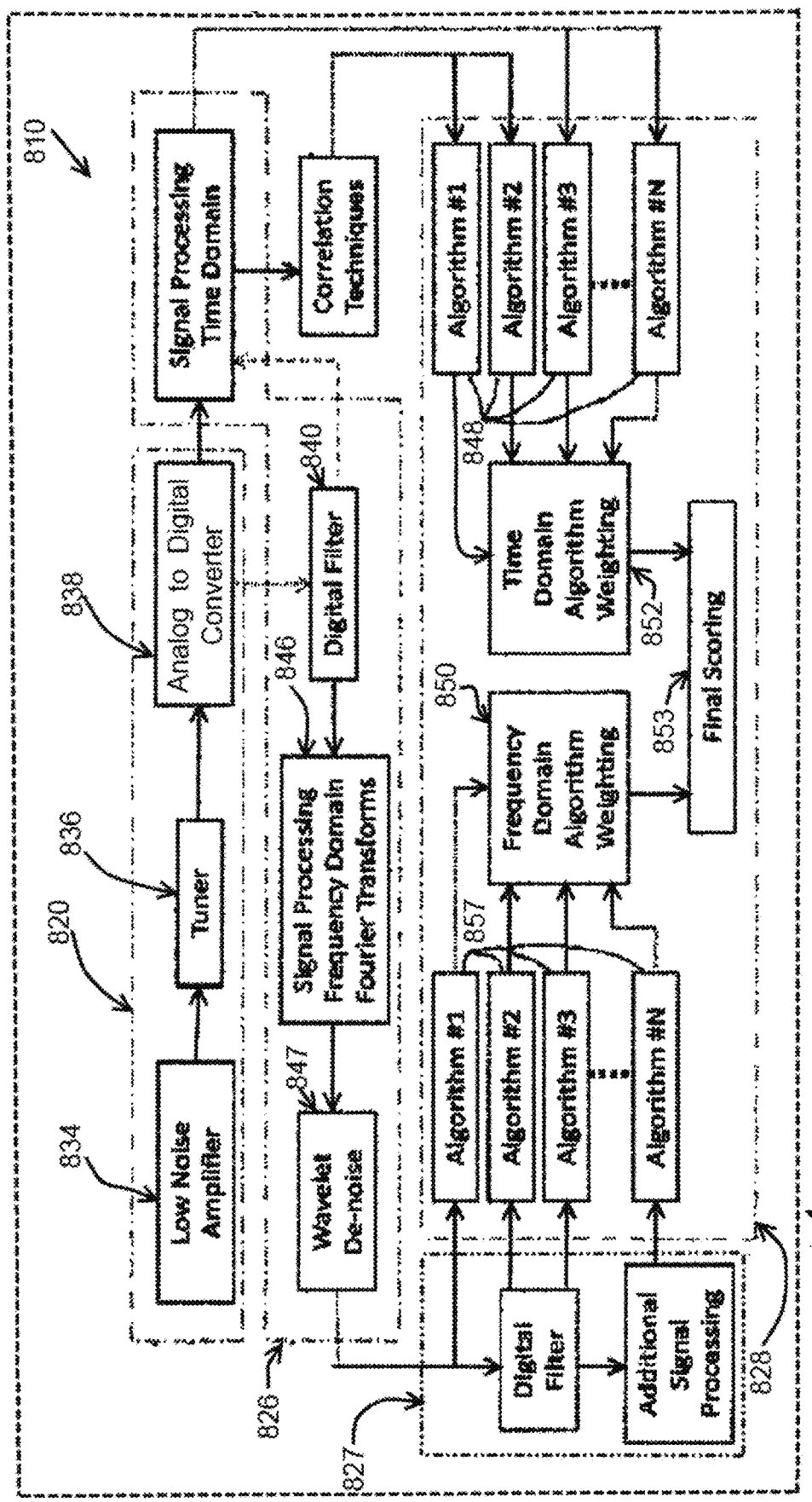
FIG. 6 illustrates a block diagram of the emission signature analyzer.

FIG. 5 illustrates one block diagram of an exemplary emission signature analyzer 140 configured to receive and process unintended emissions captured by the antenna 110 and FIG. 6 illustrates another block diagram of the emission signature analyzer 140.

A sensor is denoted with reference numeral 820 and a control unit is denoted with reference numeral 450. The control unit 450 is represented by time domain and/or frequency domain processing modules, 450A and/or 450B respectively, although either may provide needed discrimination functionality of varying capability and cost depending on the signature characteristics of the emissions radiated from the electrical component 102 and/or electrical connection 104. The components of the sensor 820 may populate one or more of the circuit board assemblies. The components of the time domain and frequency domain processing modules, 450A and 450B respectively, also populate one or more of the circuit board assemblies. The controller 450 may be also a computer loaded with the required algorithms or any other controllers suitable for executing the instructions or logic algorithms.

The sensor 820 may include a low noise amplifier (LNA) 834, an optional tuner 836 and analog to digital converter (ADC) 838. The optional tuner 836 may be of RF tuner type. The sensor 820 may be a general receiver or tuner and the general receiver may be a heterodyne or super-heterodyne receiver or equivalent. The sensor 820 may be improved by providing a broadband response.

Each of the time domain and frequency domain processing modules, 450A and 450B respectively, comprises one or more processors or logic devices, for example such as general purpose processor(s) 402 and programmable logic device 406 that may be a FPGA. Some FPGAs have logic employing multiple states that each have their own decision trees which the FPGA typically periodically cycles between. An exemplary embodiment is configured to examine each of the states in more detail and with less effective unrelated noise from adjacent states by employing a means to synchronize acquisitions in the time domain with the different states or sensed states.

DSP integrated circuit(s) (IC) 404 and a single board computer 451 may be also provided. There is also a computational medium comprising algorithms and/or executable instructions that, when executed by the one or more processors or logic devices, cause the one or more processors or logic devices to perform, in one exemplary embodiment, the following steps on the captured unintended emitted electromagnetic energy and/or the unintended conducted energy: measuring a feature value in at least one spectral frequency region of the captured unintended emitted electromagnetic energy and/or unintended conducted energy from the electrical component 102 and/or electrical connection 104, calculating a difference value between the measured feature value and a baseline feature value, and determining, based on the calculated difference value, a condition or a status of the electrical component 102.

An exemplary logic set of algorithms for comparing and matching the captured RF energy to a set of parameters identified for a baseline configuration of electrical component 102 is best shown in FIG. 6 as the logic set 810. Such logic set 810 may be carried out by the at least one processor 402. Such logic set may be carried out by other hardware or firmware manifestations to assist or perform the comparison algorithms of verifying a match with the anticipated parameters such as Programmable logic device 406 or DSP IC 404.

The logic set 810 may execute Fourier Transform 846 to convert the data in the digital filter 840 into the wavelet de-noise 847. An optional subset 827 may be used for further processing of the emission signal. At least one and plurality of algorithms 848, 850, 852, 853 and 857 in the logic subset 828 may be executed to match the data collected to the expected signature for the LRU(s) 1090. More than one algorithm may be used to match mutually exclusive parameters of the RF energy emission signature and then combine those using numerically weighted coefficients for each in a linear or nonlinear equation to yield a final overall score approximating the degree of match to an infected device. A fuzzy logic approach, neural network or other approach may be used to assist or replace this. In this manner the ability to match the collected signature to the expected signature may be improved. The weighting of these algorithms may improve the ability to analyze the electrical component 102. One factor in determining the quality of signal fed into the overall system may be the linearity, number of bits (Effective Number of Bits (ENOB)) and speed of the ADC 838 converting the raw analog time domain voltages into digital values for processing. A higher ENOB may generate less noisy data resulting in more accurate and/or faster modified/unmodified determination decisions.

Thus, the logic set 810 may include at least one of Harmonic Analysis, Matched Filter, non-harmonic correlation, timing correlation, Artificial Neural Networks (ANN), specifically multilayer perception (MLP) feed-forward ANN with back propagation (BP), Wavelet Decomposition, Autocorrelation, Spectral Feature Measurements or Statistics, Clustering or Phase Detrending algorithms.

A graphic user interface (GUI) 160 may be provided in a communication with one or both time domain and frequency domain processing modules, 450A and 450B respectively, for example through the single board computer 451. The GUI 160 may include a screen. The GUI 160 may include a display.

An optional filter 837 may be also provided with a connection 839 to the programmable logic device 406. The filter 837 may be provided when strong interfering signals from the electrical, electromechanical or electronic components located adjacent the electrical component 102 must be compensated for. It should be appreciated that reference throughout this specification to "one embodiment" or "an embodiment", "exemplary embodiment" means that a particular feature, structure or characteristic described in connection with the embodiment is included in at least one embodiment of the disclosed subject matter. Therefore, it is emphasized and should be appreciated that two or more references to "an embodiment" or "one embodiment" or "exemplary embodiment" in various portions of this specification are not necessarily all referring to the same embodiment or the same variation. Furthermore, the particular features, structures or characteristics may be combined as suitable in one or more embodiments of the disclosed subject matter.

The chosen exemplary embodiments of the claimed subject matter have been described and illustrated for practical purposes so as to enable any person skilled in the art to which it pertains to make and use the same. It is therefore intended that all matters in the foregoing description and shown in the accompanying drawings be interpreted as illustrative and not in a limiting sense. It will be understood that variations, modifications, equivalents and substitutions for components of the specifically described exemplary embodiments of the subject matter may be made by those skilled in the art without departing from the spirit and scope of the subject matter as set forth in the appended claims.

Any element in a claim that does not explicitly state "means for" performing a specified function, or "step for" performing a specified function, is not to be interpreted as a "means" or "step" clause as specified in 35 U.S.C. sctn. 112, paragraph 6. In particular, any use of "step of" in the claims is not intended to invoke the provision of 35 U.S.C. sctn. 112, paragraph 6.

Furthermore, the Abstract is not intended to be limiting as to the scope of the claimed subject matter and is for the purpose of quickly determining the nature of the claimed subject matter.

What is claimed is:

1. A method, comprising:
capturing, with an antenna disposed external to a vehicle, an emission of an electromagnetic energy in a radio frequency (RF) range from an electrical component within the vehicle;
processing, with a processing device coupled to the antenna, a signature of the emission; and
determining a condition of the electrical component based on a processed signature of the emission.

2. The method of claim 1, wherein capturing the emission comprises driving the vehicle through a hollow interior of a structure, the structure having the antenna mounted within a wall thickness of the structure.

3. The method of claim 1, wherein capturing the emission comprises driving the vehicle over a structure having the antenna disposed therewithin.

4. The method of claim 1, wherein capturing the emission comprises positioning the vehicle within a hollow interior of a structure, the antenna mounted within a wall thickness of the structure.

5. The method of claim 1, wherein capturing the emission comprises positioning the vehicle within a hollow interior of a peripheral wall and mounting the antenna within the peripheral wall.

6. The method of claim 1, wherein capturing the emission comprises positioning the vehicle within a hollow interior of a structure comprising a peripheral wall and a base and mounting the antenna within the peripheral wall.

7. The method of claim 1, wherein capturing the emission comprises positioning the vehicle within a hollow interior of a structure comprising a peripheral wall and a base and mounting the antenna within the base, the base configured to support the vehicle thereon.

8. The method of claim 1, wherein capturing the emission comprises tuning the antenna to a narrow frequency band.

9. The method of claim 1, wherein processing the emission comprises a correlation of harmonics in a signature of a captured RF emission.

10. The method of claim 1, wherein processing the emission comprises comparing amplitude versus frequency pattern in a signature of a captured RF emission.

11. The method of claim 1, wherein processing the emission comprises analyzing frequency locations of non-harmonically related peaks in a signature of a captured RF emission.

12. The method of claim 1, wherein processing the emission comprises analyzing amplitudes of non-harmonically related peaks in a signature of a captured RF emission.

13. The method of claim 1, wherein processing the emission comprises measuring a change in a signal strength as the vehicle moves relative to an antenna location.

14. The method of claim 13, further comprising determining a location of degraded emission source in the vehicle in a response to a measured change.

15. The method of claim 1, wherein processing the emission comprises providing the antenna as a plurality of antennas and spatially correlating measurements of signatures from the plurality of antennas.

16. The method of claim 1, wherein processing the emission comprises providing the antenna as a plurality of antennas, tuning antennas to different frequencies and correlating measurements of signatures across different frequencies.

17. The method of claim 1, further comprising reading, with a scanner, vehicle identification number (VIN) to uniquely identify the vehicle for future use or to reference past emissions data or emissions data evaluations of the vehicle.

18. The method of claim 17, further comprising using past emission data from different geographical locations related to the vehicle to detect a rate of degradation or a change from previously acquired RF emissions data.

19. The method of claim 1, further comprising using past emission data from different vehicles of same make and model to form an average of expected signatures of the emission representing vehicle aging to determine a degree of deviation from a baseline, and determine one of a ranking, a threshold, and a calculation made based on a percentile of the deviation.

20. A method, comprising:
positioning a portion of a vehicle over an antenna;
capturing, with the antenna, an unintended emission of an electromagnetic energy in a radio frequency (RF) range from an electrical connection or an electrical component within the vehicle;
at least converting, with an analog-to-digital converter within a receiver coupled to the antenna and receiving the emission, the emission from an analog form to a digital form;
processing, with a processing device coupled to the receiver, a signature of the unintended emission in the digital form by at least analyzing non-linear mixing products within the signature; and
determining a condition of the electrical component based on a processed signature of the unintended emission.

21. The method of claim 1, further comprise positioning the vehicle on a dynamometer to simulate a motion or loading of a drive system within the vehicle.

22. A method, comprising:
capturing, with a plurality of antennas disposed within at least one of a peripheral wall and a base of a hollow interior of a structure, emissions of electromagnetic energy in a radio frequency (RF) range from an electrical component within a vehicle positioned within the hollow interior, the plurality of antennas being tuned to different frequencies;
receiving the emissions with a receiver coupled with a cabling to the plurality of antennas;
at least converting, with an analog-to-digital converter within the receiver, a signature of each emission from an analog form to a digital form;
processing, with a processing device, the signature of the each emission in the digital form, the processing at least including measuring the signature of the each emission and correlating measurements of signatures across different frequencies; and
determining a condition of the electrical component based on processed signatures of the emissions.

23. The method of claim 22, further comprising providing the structure as a tunnel shaped enclosure with two open ends.

* * * * *